United States Patent [19]

Doyle

[11] Patent Number: 4,739,281

[45] Date of Patent: Apr. 19, 1988

[54] ANALOG BUFFER AMPLIFIER

[75] Inventor: John G. Doyle, Santa Clara, Calif.

[73] Assignee: Solid State Micro Technology for Music, Inc, Santa Clara, Calif.

[21] Appl. No.: 901,442

[22] Filed: Aug. 28, 1986

[51] Int. Cl.[4] .............................. H03F 3/45; H03F 3/30
[52] U.S. Cl. ..................................... 330/253; 330/255; 330/260; 330/264
[58] Field of Search ............... 330/253, 255, 257, 264, 330/269, 295, 260; 307/263

[56] References Cited

U.S. PATENT DOCUMENTS

| | | | |
|---|---|---|---|
| 2,994,832 | 8/1961 | James | 330/255 |
| 3,550,025 | 12/1970 | Stodolsky | 330/265 |
| 4,096,398 | 6/1978 | Khaitan | 330/269 X |
| 4,240,040 | 12/1980 | Saari | 330/255 |
| 4,542,348 | 9/1985 | Lucas et al. | 330/269 X |
| 4,636,743 | 1/1987 | Cotreau | 330/257 X |

*Primary Examiner*—James B. Mullins
*Attorney, Agent, or Firm*—Freilich, Hornbaker, Rosen & Fernandez

[57] ABSTRACT

An analog buffer amplifier for supplying an output voltage which closely follows an applied input voltage. The amplifier is characterized by a buffer output stage capable of providing both source and sink current over wide voltage swings together with circuit means for detecting slew conditions to enhance slew rate.

10 Claims, 3 Drawing Sheets

FIG. I (PRIOR ART)

ANALOG BUFFER AMPLIFIER

FIELD OF THE INVENTION

The present invention relates to improvements in analog buffer amplifiers useful in various applications for supplying an output voltage which closely follows an applied input voltage.

BACKGROUND OF THE INVENTION

The *IEEE Journal of Solid-State Circuits*, Volume SC-17, Number 6, December 1982, includes a paper by Paul R. Gray and Robert R. Meyer entitled "MOS Operational Amplifier Design—A Tutorial Overview". The paper discusses design and implementation considerations of complimentary metal oxide semiconductor (CMOS) operational amplifiers (e.g. Gray paper, FIG. 2b) and their use with output buffer stages (e.g. Gray paper, FIG. 25) for driving large capacitive or resistive loads. It is generally desirable that the buffer stage exhibit both a source (i.e. providing positive conventional current to the load) capability and a sink (i.e. negative conventional current to the load) capability. The term buffer amplifier will be used herein to refer to a circuit combination of an amplifier means, e.g. an operational amplifier, together with a buffer output stage.

Although the theoretical circuit design of buffer amplifiers is relatively straight forward, physical constraints of available CMOS technologies raise considerable problems in the implementation of such designs. For example only, a major drawback of the buffer stage depicted in FIG. 25 of the Gray paper is the high threshold of the output transistors which limits the output voltage swing. The high threshold is attributable, in part, to the typical characteristics of available CMOS technology implementations. The so called "P-well" process has the back gates of all P-channel devices connected mandatorially to the positive supply voltage. The "N-well" process has the back gates of all the N-channel devices connected to the negative supply voltage. The result is that on a "P-well" process, each P-channel output device has a high threshold when operating near the negative supply and therefore cannot provide good output swing. Similar remarks apply to the N-channel device on an "N-well" process when operated near the positive supply. This is due primarily to the "body effect" phenomenon which raises thresholds in the presence of significant back-gate reverse bias.

SUMMARY OF THE INVENTION

The present invention is directed to an improved buffer amplifier capable of enhanced output voltage swings.

In a preferred embodiment, the buffer amplifier utilizes operational amplifier means having first and second amplifier stages with the second stage controlling a buffer stage output transistor providing source current to the load in a conventional manner. Additionally, in accordance with the present invention, the operational amplifier first stage directly controls a second output transistor which provides sink current to the load.

In accordance with a further aspect of the invention, means are provided for enhancing the slew rate performance of a buffer amplifier; i.e. the rate at which the output voltage can change in response to a change in input voltage. In a preferred embodiment, a slew detect transistor is provided which responds to a sufficient voltage difference between the input and output to modify the current supply to the operational amplifier in a direction to increase the rate of change of the output voltage.

DETAILED DESCRIPTION

Analog buffer amplifiers are used in various applications for supplying a voltage at an output terminal which closely follows a voltage applied to an input terminal. The primary difference between the input and output terminals in such buffer amplifiers is that the input terminal has a very high impedance and the output terminal has a very low impedance. Thus, a load connected to the output terminal does not disturb conditions at the input terminal and thus enables signals with an inherently high impedance to drive low impedance loads without significant attenuation.

Typical buffer amplifiers are comprised of an operational amplifier followed by a buffer output stage. Important characteristics of a buffer amplifier are high input impedance, low input current, low output impedance, and high speed, i.e. the ability for the output voltage to rapidly follow the input voltage. It is additionally frequently desirable that the buffer amplifier be able to supply high drive currents over a wide voltage range.

As has been recognized, it is desirable to implement such buffer amplifiers using isolated gate field effect transistors which permit the highest input impedances to be achieved because the input electrode (gate) is electrically isolated from the current conducting electrodes (source, drain). Isolated gate field effect transistors are most frequently of the metal oxide semiconductor type (MOSFET). More specifically, modern electronic systems are increasingly implemented using complementary metal oxide semiconductor technology (CMOS) for various reasons including low power dissipation.

Figure 1:
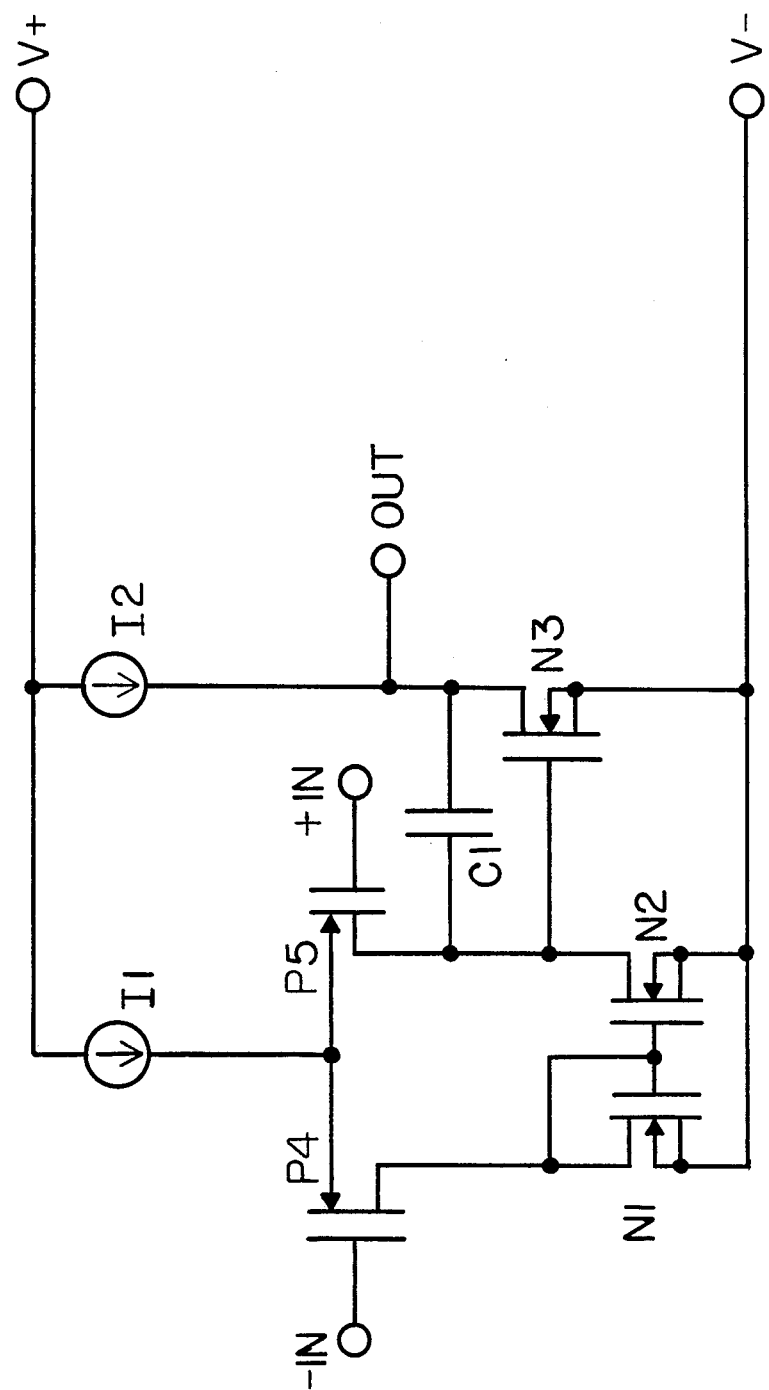
FIG. 1 is a schematic diagram of a prior art two-stage operational amplifier which is discussed in FIG. 2b of the aforementioned Gray paper.

Attention is directed to FIG. 1 which illustrates a prior art operational amplifier of the type shown and discussed in FIG. 2b of the aforementioned Gray paper. The operational amplifier of FIG. 1 includes a differential input stage comprised of transistors P4 and P5, a first amplification stage comprised of transistors N1 and N2, and a second amplification stage comprised of transistor N3. Parenthetically, it will be noted that the P-channel MOS transistors depicted in FIG. 1 (i.e. P4, P5) are represented by a symbology slightly different from the N-channel MOS transistors (i.e. N1, N2, N3). More specifically, for the N-channel transistors, the back gates are shown whereas the back gates are not shown for the P-channel transistors. This representation has been selected because in most common "P-well" implementations, the substrate is connected directly to the positive power supply V+ and P-channel device back gates are therefore not accessible. However, in such an implementation, the N-channel back gates, although typically connected to the negative power supply V−, are accessible, and thus are depicted, as represented in FIG. 1. This form of representing the P-channel and N-channel transistors will be used throughout this specification.

In the operational amplifier of FIG. 1, a supply current I1 is supplied to the source electrodes of transistors P4 and P5. The gates of transistors P4 and P5 define differential voltage input points. The voltage applied across the gate electrodes of transistors P4 and P5 determines how the supply current I1 divides and is supplied to transistors N1 and N2 of the first amplifier stage. The output of the first amplifier stage is taken at the drain of transistor N2 and applied to the gate of transistor N3, comprising the second amplifier stage. The drain and source electrodes of transistor N3 are respectively connected to the circuit output point and to the negative supply voltage V−. Feedback capacitor C1 couples the drain of transistor N3 to the drain of transistor N2.

The operational amplifier of FIG. 1 comprises a conventional high gain device in common usage and fully described in FIG. 2b of the Gray paper. Such an amplifier can feature reasonably high gain, on the order of several thousand, but it is not intended to drive heavy current loads. In order to drive such loads, some type of output buffer such as is depicted in FIG. 25 of the Gray paper can be utilized. However, for the aforementioned reasons, and as is recognized in the Gray paper, the output voltage swing of such conventional source followers is quite limited.

Figure 2:
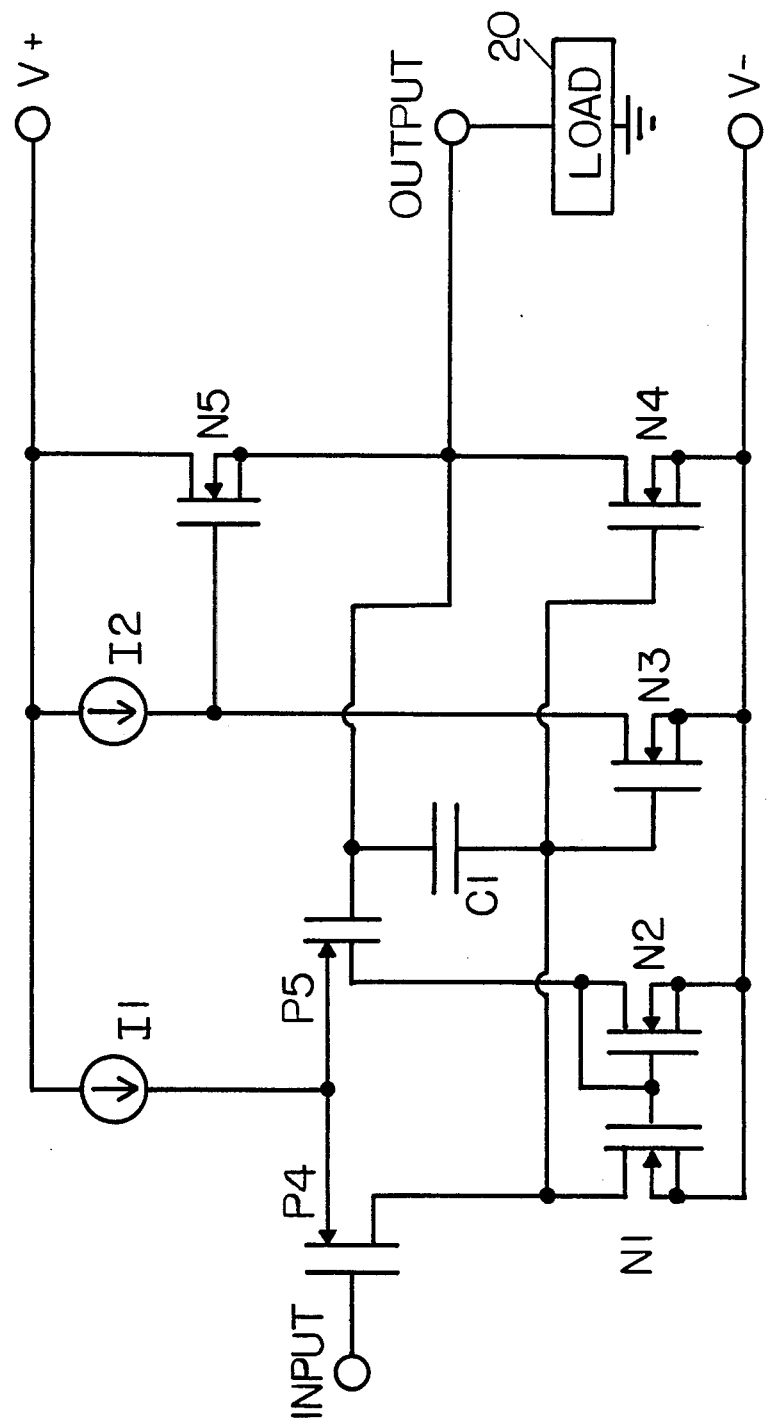
FIG. 2 is a schematic diagram of a buffer amplifier in accordance with the present invention incorporating the operational amplifier of FIG. 1 together with output transistors for supplying both source and sink current to a load.

Attention is now directed to FIG. 2 which illustrates a buffer amplifier in accordance with the present invention utilizing the conventional operational amplifier of FIG. 1 together with a buffer output stage comprised of transistors N4 and N5. Note in FIG. 2 that the operational amplifier has been depicted in the form of a single ended input device rather than a differential input device as in FIG. 1.

The output point of the operational amplifier is at the drain electrode of transistor N3, as is depicted in FIG. 1. This output is connected, as is depicted in the buffer amplifier of FIG. 2, to the the input point or gate electrode of upper transistor N5. The drain and source electrodes of transistor N5 are respectively connected to the positive voltage supply and the the buffer amplifier output terminal. Assume for the moment that output transistor N4 is absent. In this case, the operational amplifier comprised of transistors N1, N2, and N3 will drive the transistor N5 to supply a positive sourcing current to the load 20. In order to also supply a negative or sinking current to the load, transistor N4 is utilized. Note that transistor N4 is controlled by the output of the first stage of the operational amplifier. More specifically, the drain of transistor N1 is connected to the gate of transistor N4. The drain of transistor N4 is connected to the output terminal and its source is connected to the negative voltage supply.

With no load on the buffer amplifier of FIG. 2, transistor N3 will have a drain current equal to I2. Since N3 and N4 can be accurately ratioed on an integrated circuit, the drain current of N3 also defines the drain current of N4 and hence the quiescent current in N5. When positive or sourcing current is to be supplied to the load 20, the action of the buffer amplifier is conventional. N3 and N4 turn off slightly causing the drain voltage of N3 to rise, thus turning on N5 to supply the positive source current to the load. Note that N5 could comprise a parasitic NPN bipolar transistor without affecting circuit operation since the drain (substrate) is at the same potential as the positive supply.

When the load 20 demands negative or sink current exceeding the quiescent current in N4, N5 turns off completely and N3 no longer has any control over the output. Under these conditions, the signal from the drain of P4 (drain of N1) is fed directly to the gate of N4 which in turn provides the necessary sink current to the load. The maximum negative voltage output swing is determined by the ratio of the load resistance to the minimum channel resistance of N4. The channel resistance of N4 is determined both by the size of N4 and by the maximum voltage excursion at its gate. Note that this swing is not restricted by the threshold voltage of either the P-channel or N-channel transistors and thus circumvents any "body effect" problems.

It should be understood in connection with FIG. 2 that there is a maximum rate at which the output voltage can change which is determined by the charge/discharge rate of capacitor C1. Capacitor C1 is necessary to provide phase compensation for the operational amplifier to insure that no oscillations occur with the 100% feedback employed.

When a large voltage change is applied at high speed to the input terminal of the buffer amplifier of FIG. 2, either P4 or P5 will turn off depending on the direction of the voltage change. The current I1 is now available for charging and discharging capacitor C1, either directly or through the "current mirror" formed by N1 and N2. Thus the maximum rate of change of the output is given by:

$$\frac{dVout}{dT} = \frac{1}{C1} \frac{dQ}{dT} = \frac{I1}{C1} \text{ since } Q = \int I1 dT$$

Where:
Q is the charge on C1
T is time.

This maximum rate of change is known as the "slew rate" and places severe restrictions upon the amplitude of the signal that can be handled at a given frequency or conversely, upon the frequency of signal at a given amplitude.

From the above equation, it can be recognized that the slew rate can be increased either by reducing C1 or by increasing I1. Reducing C1 tends to cause instability since inevitable degradation of the phase compensation will occur. Increasing I1 will simultaneously increase the transconductance of P4 and P5. This has similar effects on stability since it decreases the effectiveness of C1. Deliberate reduction of the transconductance of P4 and P5 does allow reduction of C1 or increased I1, and this is a common way of improving slew rate. This can be achieved either by making P4 and P5 weak devices or by inserting resistors in series with their sources. In both cases, however, reduced transconductance leads to poor DC performance.

Figure 3:
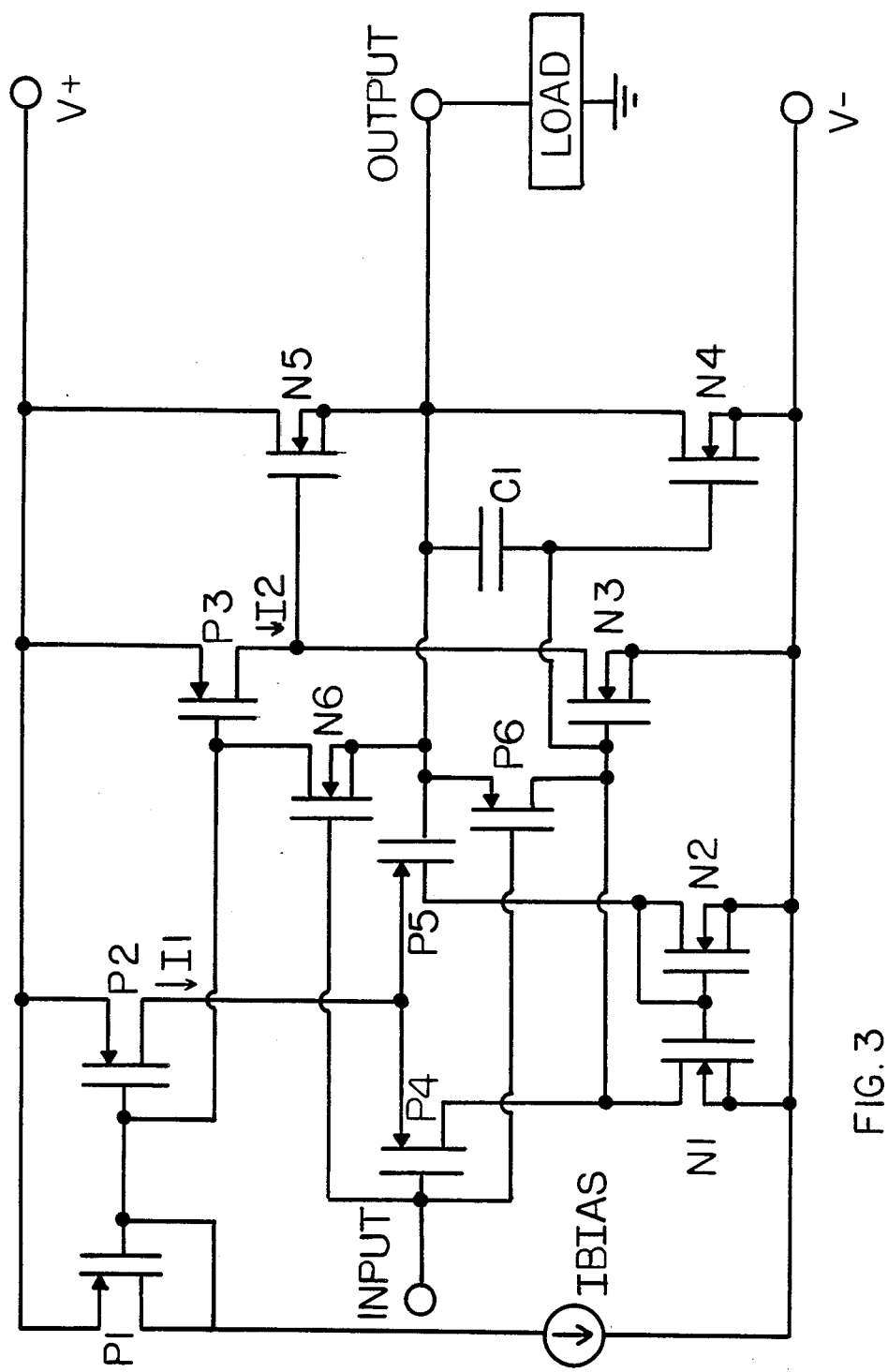
FIG. 3 is a schematic diagram of the buffer amplifier of FIG. 2 modified to include slew enhancement circuitry.

Attention is now directed to FIG. 3 which depicts the buffer amplifier of FIG. 2 modified to include circuitry to enhance the slew rate. Note that FIG. 3 differs from FIG. 2 in that P-channel transistors P2 and P3 are depicted for supplying the aforementioned currents I1 and I2. Transistors P2 and P3, in turn, have their currents defined by Ibias and transistor P1.

Additionally, FIG. 3 incorporates two slew detect transistors N6 and P6. Note that the gates of both transistors N6 and P6 are connected to the input terminal and that the source electrodes of both are connected to the output terminal. The drain of transistor N6 is connected to the Ibias current source and the drain of transistor P6 is connected to one terminal of capacitor C1.

In normal operation, transistors N6 and P6 are both completely shut off since the normal action of the buffer amplifier is for the output to closely follow the input. Under these conditions, the gate source voltage across each of transistors N6 and P6 will be essentially 0 and below the approximately 1 volt threshold of these devices.

If a fast rising voltage is now applied to the input terminal, the output voltage will lag behind due to the aforementioned slew rate limitation. Under these conditions, N6 will start to conduct. The drain current of N6 directly adds to Ibias and thus increases the magnitude of current I1. From the discussion of the foregoing equation, it will be recognized that this increase in current I1 effectively increases the slew rate of the amplifier. Instability cannot occur because N6 only turns on when the amplifier is operating nonlinearly, and no feedback exists to cause oscillation.

Whereas N6 functions to enhance slew rate increase for one direction of input signal change, i.e. fast rise, transistor P6 is provided to handle the slew rate limitation with respect to an opposite condition, i.e. a fast falling signal at the input. Although a similar approach could be taken such that transistor P6, or an equivalent, also increases the magnitude of current I1, a simpler solution is depicted in FIG. 3 in which transistor P6 responds to a voltage difference between the output and input terminals which exceeds its threshold by starting to conduct so that its drain current discharges capacitor C1 directly.

As a consequence of the action of the slew detect transistors N6 and P6, the buffer amplifier of FIG. 3 exhibits a much enhanced slew rate for both positive and negative going input signals with no degradation of DC performance.

From the foregoing, it should now be recognized that an improved buffer amplifier has been disclosed herein which is capable of exhibiting large voltage swings to supply both positive source and negative sink current to a load and to do this in a manner which enables the output voltage to closely follow the input voltage even for fast rising or falling signals.

I claim:

1. A buffer amplifier having an input terminal and an output terminal for producing a voltage at said output terminal which closely follows a voltage applied to said input terminal, said buffer amplifier comprising:
   amplifier means having a first stage and a second stage, each stage having an input point and an output point, said first stage input point comprising said input terminal and said first stage output point being connected to said second stage input point;
   output buffer means including a first output transistor having an input point and an output point respectively connected to said second stage output point and said output terminal for supplying current in a first direction to said output terminal;
   a second output transistor having an input point and an output point respectively connected to said first stage output point and said output terminal for supplying current in a section direction to said output terminal; and
   slew detect means responsive to a voltage difference between said input and output terminals exceeding a certain threshold for varying a bias current supplied to said amplifier means.

2. The buffer amplifier of claim 1 wherein said amplifier means comprises a high gain operational amplifier including complementary field effect transistors implemented on a common substrate.

3. The buffer amplifier of claim 2 wherein said first and second output transistors each comprises a field effect transistor implemented on said common substrate.

4. The buffer amplifier of claim 3 wherein each of said first and second output transistors includes gate, source, and drain electrodes and wherein said first and second output transistor gate electrodes comprise said input points and said first and second output transistor source and drain electrodes respectively comprise said output points; and
   means respectively connecting said first and second output transistor drain and source electrodes respectively to supply potentials of opposite polarity.

5. The buffer amplifier of claim 1 wherein said slew detect means includes a field effect transistor having gate, source, and drain electrodes; and wherein
   said slew detect transistor gate and source electrodes are connected across said input and output terminals.

6. A buffer amplifier having an input terminal and an output terminal for producing a voltage at said output terminal which closely follows a voltage applied to said input terminal, said buffer amplifier comprising:
   amplifier means having an input point connected to said input terminal, and an output point;
   output buffer means having an input point connected to said amplifier means output point for supplying current to said output terminal; and
   slew detect means defining a certain threshold and responsive to a voltage difference between said input and output terminals exceeding said threshold for varying a current supplied to said amplifier means to modify the voltage at said output terminal.

7. The buffer amplifier of claim 6 wherein said slew detect means includes a field effect transistor having gate, source, and drain electrodes; and wherein
   said slew detect transistor gate and source electrodes are connected across said input and output terminals.

8. The buffer amplifier of claim 6 wherein said amplifier means comprises a high gain operational amplifier including complementary field effect transistors implemented on a common substrate.

9. The buffer amplifier of claim 8 wherein said slew detect means includes a field effect transistor implemented on said common substrate.

10. The buffer amplifier of claim 9 wherein said slew detect transistor has gate, source and drain electrodes; and wherein
    said slew detect transistor gate and source electrodes are connected across said input and output terminals.

* * * * *